United States Patent
Gravati et al.

(10) Patent No.: US 9,094,006 B2
(45) Date of Patent: Jul. 28, 2015

(54) CONTROL DEVICE FOR A RESONANT APPARATUS

(71) Applicant: STMicroelectronics S.r.l., Agrate Brianza (IT)

(72) Inventors: Mirko Gravati, Genoa (IT); Christian Leone Santoro, Milan (IT); Claudio Adragna, Monza (IT); Aldo Vittorio Novelli, S. Lorenzo Parabiago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 174 days.

(21) Appl. No.: 13/888,180

(22) Filed: May 6, 2013

(65) Prior Publication Data

US 2013/0293267 A1 Nov. 7, 2013

(30) Foreign Application Priority Data

May 7, 2012 (IT) .................. MI12A0766

(51) Int. Cl.

| | |
|---|---|
| *H02M 3/156* | (2006.01) |
| *H03K 17/082* | (2006.01) |
| *H02M 1/32* | (2007.01) |
| *H02M 3/338* | (2006.01) |
| *H02M 1/36* | (2007.01) |
| *H02M 1/38* | (2007.01) |
| *H02M 1/00* | (2007.01) |

(52) U.S. Cl.
CPC .............. *H03K 17/082* (2013.01); *H02M 1/32* (2013.01); *H02M 3/3382* (2013.01); *H02M 1/36* (2013.01); *H02M 1/38* (2013.01); *H02M 2001/0058* (2013.01); *Y02B 70/1433* (2013.01); *Y02B 70/1491* (2013.01)

(58) Field of Classification Search
CPC ... H02M 3/156; H02M 3/1588; H02M 3/157; H02M 3/33569; H02M 3/33507; Y02B 70/1433
USPC .................. 363/20, 21.02, 21.03, 95, 97, 131; 323/282–285, 351
See application file for complete search history.

(56) References Cited

U.S. PATENT DOCUMENTS

| 5,615,093 A | 3/1997 | Nalbant | |
| 5,680,301 A * | 10/1997 | Oughton et al. ............... | 363/132 |
| 7,773,398 B2 * | 8/2010 | Kyono ........................... | 363/127 |
| 7,848,117 B2 * | 12/2010 | Reinberger et al. ............. | 363/16 |
| 7,885,085 B2 * | 2/2011 | Orr et al. ..................... | 363/21.02 |

(Continued)

FOREIGN PATENT DOCUMENTS

WO 2010/115976 A1 10/2010

*Primary Examiner* — Adolf Berhane
(74) *Attorney, Agent, or Firm* — Seed IP Law Group PLLC

(57) ABSTRACT

A control device of a switching circuit of a resonant apparatus is described. The switching circuit comprises at least one half-bridge having a high-side transistor and a low-side transistor connected between an input voltage and a reference voltage; the resonant apparatus comprises a resonant load. The control device is configured to determine the on time period and the off time period of the transistors alternatively and a dead time of both the transistors so that a periodic square-wave voltage is applied to the resonant load. The control device comprises a detector adapted to detect the current sign flowing through the resonant load and a correction circuit configured to extend the current operating time period of said two transistors in response to at least the current sign detected from the detection means.

25 Claims, 9 Drawing Sheets

(56) References Cited

U.S. PATENT DOCUMENTS

| | | | |
|---|---|---|---|
| 7,944,085 B2 * | 5/2011 | Kyono | 307/31 |
| 8,064,229 B2 * | 11/2011 | Stuler | 363/21.06 |
| 8,107,263 B2 * | 1/2012 | Ueno et al. | 363/21.02 |
| 8,212,591 B2 | 7/2012 | Pidutti et al. | |
| 8,717,784 B2 * | 5/2014 | Park et al. | 363/21.02 |
| 2011/0187335 A1 | 8/2011 | Grakist et al. | |

* cited by examiner

CONTROL DEVICE FOR A RESONANT APPARATUS

BACKGROUND

1. Technical Field

The present disclosure relates to a control device for a resonant apparatus.

2. Description of the Related Art

A resonant apparatus as a resonant converter is known in the state of the art, using a half-bridge or a full-bridge as a switching circuit. In the case of half-bridge resonant converter, the switching circuit comprises a high-side transistor and a low-side transistor connected in series between an input voltage and ground. A square wave having a high value corresponding to the power supply voltage and a low value corresponding to ground may be generated by conveniently switching the two transistors. A small time interval Td called "dead time", during which the transistors are off, is typically added immediately after each of them is switched off.

In resonant converters, the square wave generated by the half-bridge is applied to the primary winding of a transformer by means of a resonant network which comprises at least one capacitor and one inductor; the secondary winding of the transformer is connected with a rectifier circuit and a filter to provide an output constant voltage. The value of the output voltage depends on the frequency of the square wave.

The so-called LLC resonant converter is often used among the several types of resonant converters, especially the half-bridge LLC resonant converter (the designation comes from the resonant circuit employing two inductors (L) and a capacitor (C)); a schematic circuit of an LLC resonant converter is shown in FIG. 1. The resonant converter 1 in FIG. 1 comprises a half-bridge of transistors Q1 and Q2, with respective body diodes Db1 and Db2, driven by a control device 3 by means of the signals HSGD and LSGD. The common terminal HB between transistors Q1 and Q2 is connected to a resonant circuit 2 comprising a series of a capacitor Cr, an inductance Ls, and a parallel circuit that includes another inductance Lp, connected in parallel to a primary winding of a transformer 10 with a center-tap secondary. The inductance Lp is connected to a sense resistance Rs connected to ground GND and the voltage Vs across the resistance Rs is sensed by the control device 3. The two windings of the center-tap secondary of transformer 10 are connected to the anodes of two diodes D1 and D2, the cathodes of which are both connected to the parallel of a capacitor Cout and a resistance Rout. The output voltage Vout of the resonant converter is the voltage across said parallel, while the output current Tout flows through the resistance Rout. The resonant converter 1 comprises a feedback circuit including an error operational amplifier 6 frequency compensated by means of the circuit element 5 and having an inverting input terminal that receives the voltage Vr=Vout*R2/(R1+R2) and a non-inverting terminal that receives a reference voltage Vref. The output voltage of the operational amplifier 6 is at the input of an optocoupler 4 adapted to provide the voltage Vc to the control device 3.

Resonant converters offer considerable advantages as compared to traditional switching converters (non-resonant, typically PWM-controlled (Pulse Width Modulation)): waveforms without steep edges, low switching losses in the power switches due to "soft" switching thereof, high conversion efficiency (>95% is easily reachable), ability to operate at high frequencies, low EMI (electro-magnetic interference) generation and, finally, high power density (i.e. enabling to build conversion systems capable of handling considerable powers levels in a relatively small space).

However, the same resonant converters are affected by certain disadvantages during the start-up step. In said step, when the high-side transistor Q1 is switched on the first time, the voltage seen by the primary winding is substantially equal to the power supply voltage. In the successive semi-period of the square wave, when the low-side transistor Q2 is switched on, the voltage seen by the primary winding is substantially equal to the voltage across the capacitor Cr; therefore, the current flowing through the resonant network increases more quickly during the on state of the high-side transistor, while decreases less quickly during the on state of the low-side transistor. Thereby, with a 50% duty cycle, when the low-side transistor is switched off again, the current flows through the body diode Db2 thereof When the high-side transistor is switched on again, a reverse voltage is developed across the body diode Db2 of the low-side transistor, while the diode Db2 is still conducting. Under said conditions, the high-side transistor is switched on under hard switching conditions and the diode Db2 is stressed in reverse recovery. Therefore, both the high-side transistor and the low-side transistor are conductive in the same time period by short-circuiting the supply terminal with the ground terminal until the body diode Db2 is recovered. Under such conditions, the voltage at the terminals of the transistor may vary so quickly that the intrinsic, parasitic bipolar transistor of the transistor MOSFET structure may be triggered thus causing a condition of shoot-through which may cause the destruction of the transistor in few microseconds.

A solution to the hard switching problem is known from U.S. Pat. No. 8,212,591 which discloses an apparatus and a method for controlling a resonant switching system that includes a first switch and a second switch in a half-bridge configuration for driving a resonant load. A control system includes a driver for switching on and switching off the switches alternatively according to a working frequency of the switching system. The control system includes a detector for detecting a zeroing of the working current supplied by the switching system to the resonant load in a temporal observation window. The observation window follows each switching off of at least one of the switches, and has a length equal to a fraction of a working period of the switching system. A correction circuit is provided for modifying the working frequency in response to each detection of the zeroing in the observation window.

A further mechanism can be used for the apparatus of U.S. Pat. No. 8,212,591 to prevent hard switching during the start-up step, that is to prevent the hard switching of the high side transistor that occurs during the start-up step at the end of the on time period of the low side transistor.

This mechanism, that consists in synchronizing the oscillator to the zero crossing of the current, modifies the working frequency of the switching system and therefore must be deactivated after the start-up step.

BRIEF SUMMARY

One aspect of the present disclosure is to provide a control device for a resonant apparatus, for example a resonant converter, which detects and prevents the hard switching in any operation step of the converter without adding a further mechanism to prevent hard switching during the start-up step of the converter.

One aspect of the present disclosure is a control device for controlling a switching circuit of a resonant apparatus, said switching circuit comprising at least one half-bridge having a high-side transistor and a low-side transistor connected between an input voltage and a reference voltage, and said resonant apparatus comprising a resonant load. Said control device is configured to alternately determine the on time period and the off time period of said two transistors and a dead time of both the transistors so that a periodic square-wave voltage is applied to the resonant load. The control devices also includes a detector configured to detect the sign of the current flowing through the resonant load and a correction circuit configured to extend the operation time period of said two transistors in response to at least the current sign detected by the detector.

BRIEF DESCRIPTION OF THE SEVERAL
VIEWS OF THE DRAWINGS

The features and advantages of the present disclosure will become apparent from the following detailed description of embodiments thereof, illustrated only by way of non-limitative example in the annexed drawings, in which.

DETAILED DESCRIPTION

Figure 1:
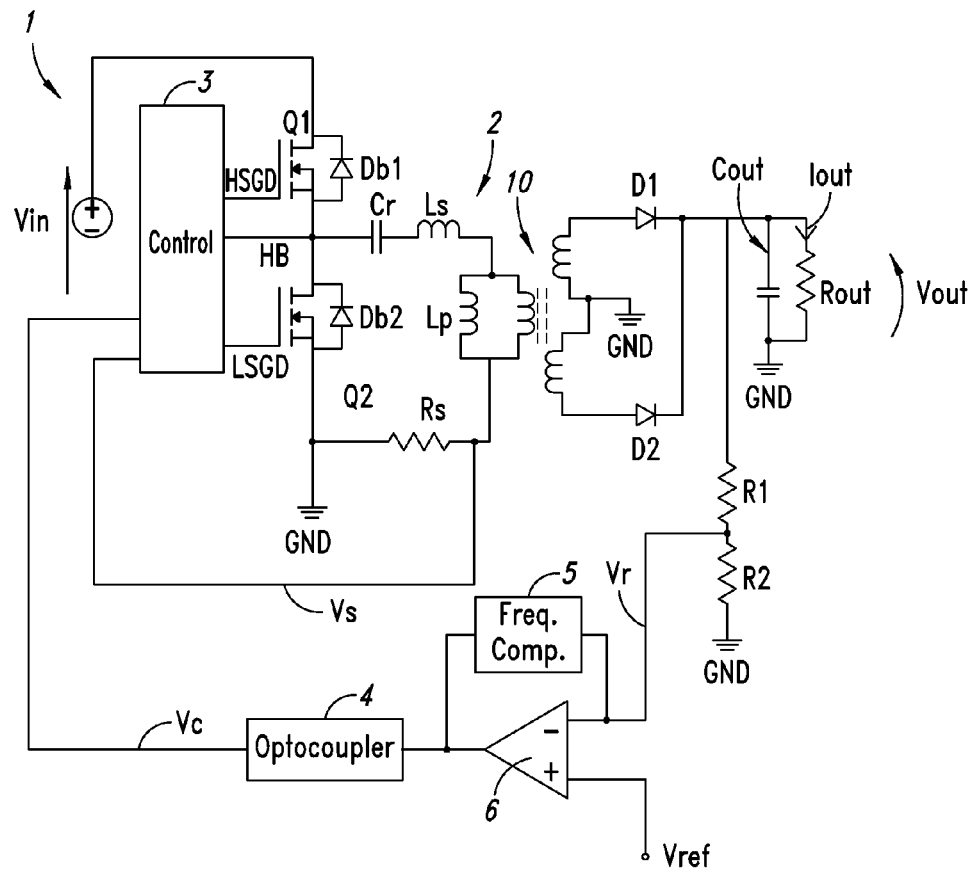
FIG. 1 is a circuit schematic of a resonant converter according to prior art.
Figure 2:
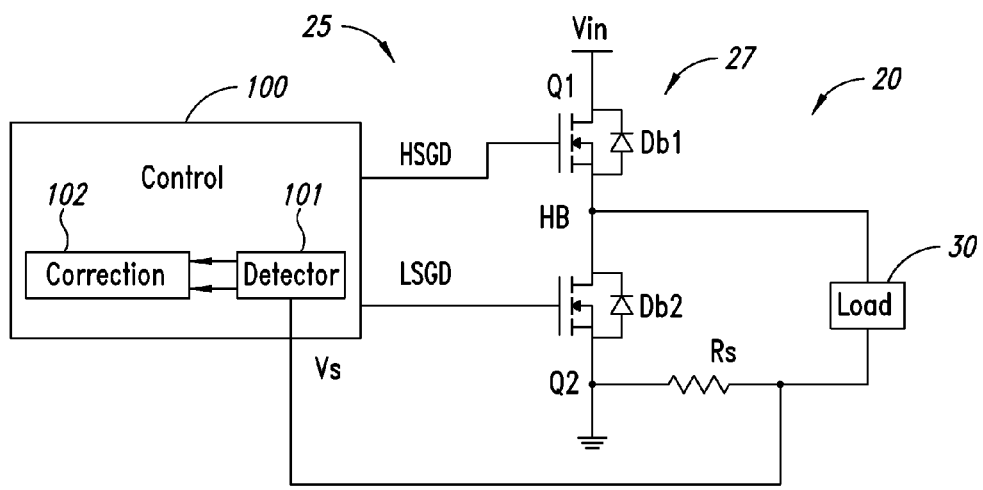
FIG. 2 is a circuit schematic of a resonant apparatus according to the present disclosure.

FIG. 2 shows a resonant apparatus 20 according to the present disclosure. The resonant apparatus 20 comprises a switching circuit 25 including at least one half-bridge 27 of transistors Q1 and Q2, so called respectively high side and low side transistors, with respective body diodes Db1 and Db2, between the input voltage Vin and ground GND, driven by a control device 100 by the signals HSGD and LSGD. The common terminal HB between transistors Q1 and Q2 is connected to a resonant load 30, the source terminal of the transistor Q2 is connected to ground GND and the resonant load 30 is coupled to ground GND by a sense resistance Rs. The current Isense flowing through the sense resistance Rs is the current flowing through the resonant load 30.

The control device 100 according to the present disclosure comprises a detector 101 configured to detect the sign of the current Isense flowing through the sense resistance Rs and a correction circuit 102 configured to control the extension of the current operation time period of the transistors Q1 and Q2, that is the on time period Ton or the dead time Td of both high and low side transistors. The correction circuit controls the extension of the current operation time period in response to at least a first piece of information $CURB_{13}$ POS, $CURB_{13}$ NEG, that is only the first piece of information, or to a combination of the first piece of information $CURB_{13}$ POS, $CURB_{13}$ NEG and a second piece of information INF. The first piece of information $CURR_{13}$ POS, $CURB_{13}$ NEG is representative of the detected current sign while the second piece of information INF is representative of the transistor which is in on time period Ton, that is currently switched on, or if both the transistors are in dead time Td, the second piece of information is representative of the transistor that will be switched on at the end of the dead time Td. The detector 101 receives the signal Vs representative of the current Isense and detects the positive or negative sign of the current Isense. Particularly the detector 101 is configured to detect if the voltage Vs is outside or inside a prefixed band voltage around the zero value, particularly higher than a negative threshold value −Vos or lower than a positive threshold value Vos, wherein preferably the negative threshold value and the positive threshold value are equal in absolute value. If the voltage Vs is inside the prefixed band voltage, the correction circuit 102 force the extension of the current operating time period of the transistors Q1 and Q2, that is the on time period Ton or the dead time Td of both high and low side transistors. If the voltage Vs is outside of the prefixed band voltage the correction circuit 102 controls the extension of the current operating time period of the transistors Q1 and Q2 according to the second piece of information INF. The first piece of information CURR_POS, $CURR_{13}$ NEG is produced by the detector 101 while the second piece of information INF is provided by the same control device 100. In fact the control device 100 comprises a driver configured to provide driving signals HSGD, LSGD for the transistors Q1 and Q2 so that said two transistors are switched on alternatively.

Figure 3:
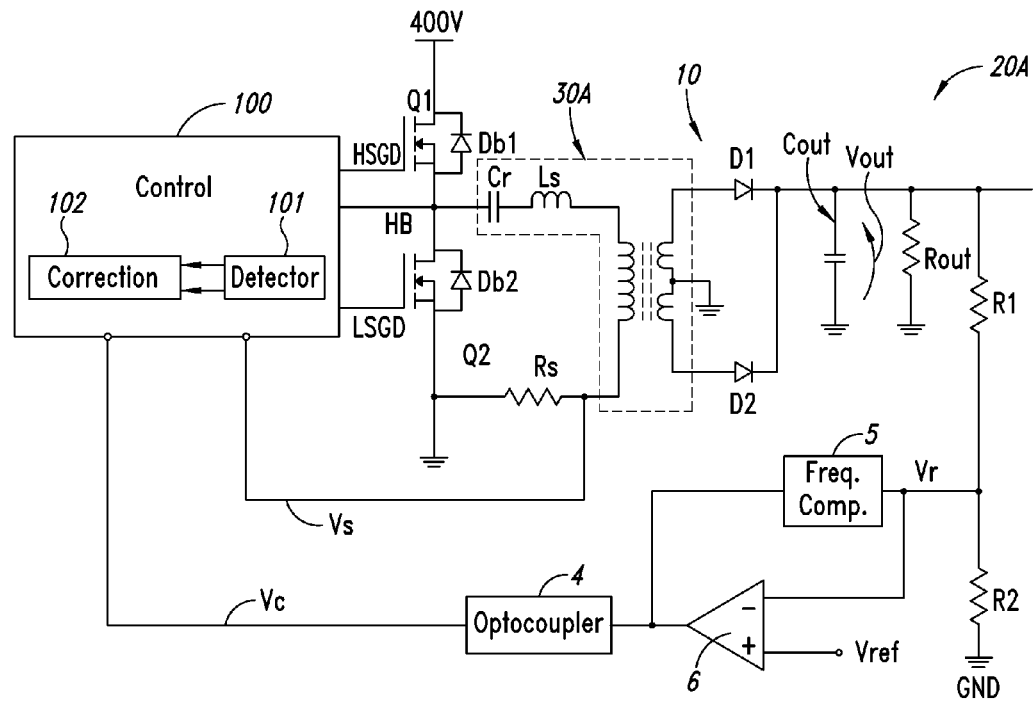
FIG. 3 is a circuit schematic of a resonant converter according to a first embodiment of the present disclosure.

A resonant apparatus 20A according to a first embodiment of the present disclosure (FIG. 3) is a resonant converter wherein the load 30A is a resonant circuit comprising a series of a capacitor Cr, an inductance Ls, and a primary winding of a transformer 10 with a center-tap secondary. The primary winding of the transformer is connected to a sense resistance Rs connected to ground GND and the voltage Vs across the resistance Rs is at the input of the detector 101. The two windings of the center-tap secondary of transformer 10 are connected to the anodes of two diodes D1 and D2, the cathodes of which are both connected to the parallel of a capacitor Cout and a resistance Rout. The output voltage Vout of the resonant converter is the voltage across said parallel, while the output current Iout flows through the resistance Rout. The resonant converter comprises a feedback circuit including an error operational amplifier 6 frequency compensated by the circuit element 5 and having at an inverting input terminal that receives the voltage Vr=Vout*R2/(R1+R2) and at a non-inverting terminal that receives a reference voltage Vref. The output voltage of the operational amplifier 6 is at the input of an optocoupler 4 adapted to provide the voltage Vc to the control device 100.

A resonant apparatus 20B according to a second embodiment of the present disclosure (FIG. 4) is a lighting apparatus in which the control circuit 100 and switching circuit 25 act as a ballast and the resonant load comprises a lamp 105. The ballast is adapted to control a power supply of the lamp 105, both for switching on the lamp and for adjusting its brightness. The voltage Vin is a supply voltage, for example a direct supply voltage of 300V. The resonant load 30B, which is connected with the terminal HB, comprises a series of an inductor L, the lamp 105, and a capacitor C1. A capacitor C2 is connected in parallel to the lamp 105 while the capacitor C1 is connected to the sense resistance RS connected to ground GND. When the lamp 105 is switched on, the capacitor C2 is by-passed by the lamp 105 (having a very low resistance). In such condition, the resonant circuit allows the control of the operation current through the lamp 105 by varying the frequency fo if the voltage at the node HB (with the working current reaching a maximum value when the working frequency fo is equal to a resonance frequency of the resonant load 30, and decreasing when the frequency fo departs from this value). On the contrary, when the lamp 105 is switched off (with a very high resistance), the capacitor C2 allows the application of a very high voltage to switch on the lamp 105 (up to the voltage at the node HB multiplied by a quality factor of the resonant load 30 at the resonance frequency).

As generally known, the control device 100 drives the transistors Q1 and Q2 with the signals HSGD and LSGD which assume a low level (for example ground GND) for switching off the respective transistors Q1 and Q2 or a high level for switching on the respective transistors Q1 and Q2. The signals HSGD and LSGD are always opposite to each other for switching on (for the time period Ton) only one transistor Q1, Q2 and are not overlapped, so that each signal HSGD, LSGD is brought to the high level with a predetermined delay (so called dead time Td) with the respect to the instant wherein the other signal HSGD, LSGD is brought to the low level; this ensures that the two transistors Q1, Q2 are not on simultaneously.

Figure 5:
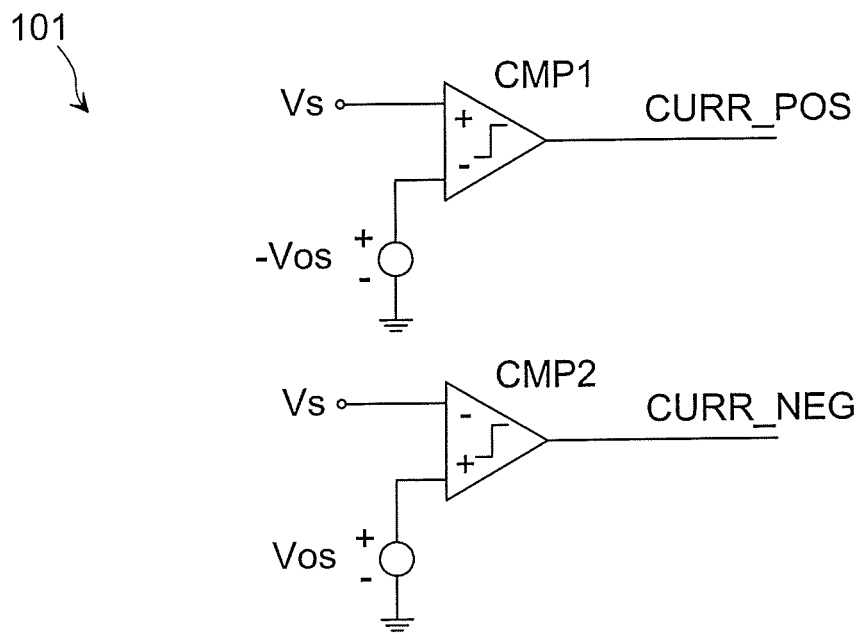
FIG. 5 is a circuit schematic of a part of the control device of the resonant apparatus in FIG. 2.
Figure 6:
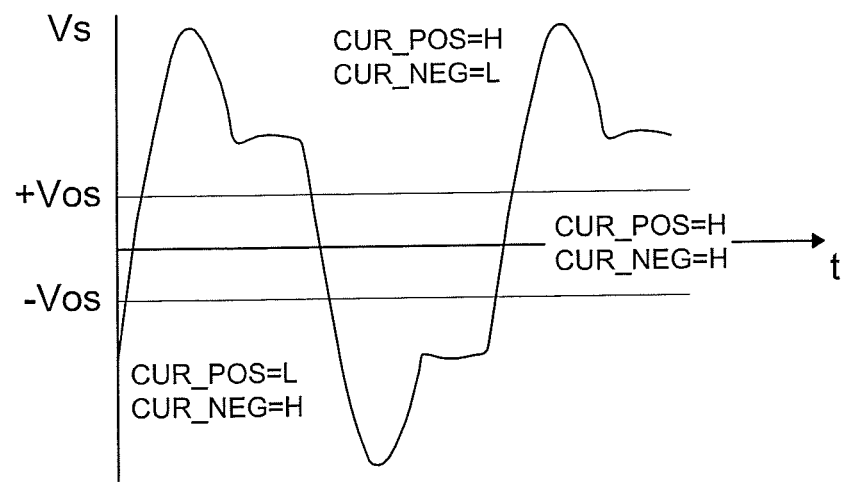
FIG. 6 shows a time diagram of the current detected by the sense resistance.

The detector 101, as shown in FIG. 5, preferably includes comparators CMP1 and CMP2 adapted to compare the voltage Vs with an offset voltage Vos. In particular, the comparator CMP1 is configured to compare the voltage Vs at its non-inverting input terminal with the negative offset voltage −Vos at its inverting input terminal, while the comparator CMP2 is configured to compare the voltage Vs at its inverting input terminal with the positive offset voltage Vos at its non-inverting input terminal If the voltage Vs is higher than −Vos, the sign of the current Isense is considered positive and the output signal CURR_POS is set at the high logic value H; while if the voltage Vs is lower than Vos, the sign of the current Isense is considered negative and the output signal CURR_NEG is set at the high logic value H. In the case wherein the voltage Vs is within the value band −Vos to +Vos, both the signals CURR_POS and CURR_NEG are set at the high logic value H, as shown in the time diagram of FIG. 6.

The information on the sign of the current Isense is used to detect the possible hard switching condition. The hard switching condition is detected at the end of the dead time Td or at the end of the on time period Ton. If the current sign is "correct", the correction circuit 102 does not act on the control device 100 to extend the on time period Ton or the dead time period Td. In particular, the current sign is "correct" if: 1) the current Isense is positive when the transistor Q2 will be switched on and the transistors Q1 and Q2 are in dead time Td or the transistor Q1 is currently switched on, or 2) the current Isense is negative when the transistor Q1 will be switched on and the transistors Q1 and Q2 are in dead time condition Td or the transistor Q2 is currently switched on.

If the current sign is "not correct", the correction circuit 102 acts on the control device 100 to extend the current operation time period of the transistors Q1 and Q2, that is if both the transistors Q1 and Q2 currently are in the dead time Td, the dead time will be extended or if the transistor Q1 or Q2 is currently in the on state Ton, the on time period Ton will be extended. The current sign is "not correct" if: 1) the current Isense is negative when the transistor Q2 will be switched on and the transistors Q1 and Q2 are in dead time Td or the transistor Q1 is currently switched on; or 2) the current Isense is positive when the transistor Q1 will be switched on and the transistors Q1 and Q2 are in dead time Td or the transistor Q2 is currently switched on. The extension of the time period Ton or Td occurs as long as the current sign is not corrected; when the current sign becomes correct the time extension ends.

For the on time period Ton the correction circuit 102 checks that the current sign is coherent with the currently on transistor, as specified in Table 1.

TABLE 1

| Currently on transistor | CURR_POS | CURR_NEG | EXTENSION |
|---|---|---|---|
| Q1 | H | L | INACTIVE |
| Q1 | L | H | ACTIVE |
| Q1 | H | H | ACTIVE |
| Q2 | H | L | ACTIVE |
| Q2 | L | H | INACTIVE |
| Q2 | H | H | ACTIVE |

When the transistor Q1 is on and the signals CURR_POS=H and CURR_NEG=L (current sign is positive) or when the transistor Q2 is on and the signals CURR POS=L and CURR NEG=H (current sign is negative), the correction circuit 102 is inactive and the control device 100 can switch off the transistor Q1 or Q2 (indicated by the word INACTIVE in the column EXTENSION). In these cases the soft-switching condition is verified. When the transistor Q2 is on and the signals CURR_POS=H and CURR_NEG=L or when the transistor Q1 is on and the signals CURR_POS=L and CURR_NEG=H or when the signals CURR_POS=CURR_NEG=H with Q1 or Q2 on the current sign is not correct, the correction circuit 102 controls the extension of on time period Ton of the transistor, which is indicated in Table 1 with the word ACTIVE in the column EXTENSION.

For the dead time period the correction circuit 102 checks that the current sign is coherent with the transistor to be switched-on, as specified in Table 2.

TABLE 2

| Transistor to be switched-on | CURR_POS | CURR_NEG | EXTENSION |
|---|---|---|---|
| Q1 | H | L | ACTIVE |
| Q1 | L | H | INACTIVE |
| Q1 | H | H | ACTIVE |
| Q2 | H | L | INACTIVE |
| Q2 | L | H | ACTIVE |
| Q2 | H | H | ACTIVE |

When the transistor Q1 is next to be switched-on and the signals CURR_POS=L and CURR_NEG=H (current sign is negative) or when the transistor Q2 is next to be switched-on and the signals CURR_POS=H and CURR_NEG=L (current sign is positive), the correction circuit 102 is inactive and the control device 100 can switch on the transistor Q1 or Q2 respectively (indicated by the word INACTIVE in the column EXTENSION). When the transistor Q2 is next to be switched-on and the signals CURR_POS=L and CURR_NEG=H or when the transistor Q1 is next to be switched-on and the signals CURR_POS=H and CURR_NEG=L or when Q1 and Q2 are in dead time and the signals CURR_POS=CURR_NEG=H, the current sign is not correct, the correction circuit 102 controls the extension of the dead time period Td, which is indicated in Table 2 with the word ACTIVE in the column EXTENSION.

Preferably, in the case wherein the voltage Vs remains within the value band −Vos to +Vos for a time period longer than a prefixed time period Tcount, for example 5 microseconds, the extension of the dead time Td or the on time Ton is stopped. The control device 100 preferably comprises a timer 103 (FIG. 7) activated when the signals CURR_POS=CURR_NEG=H and adapted to deactivate the correction circuit 102 after a counted time period Tcount.

Figure 7:
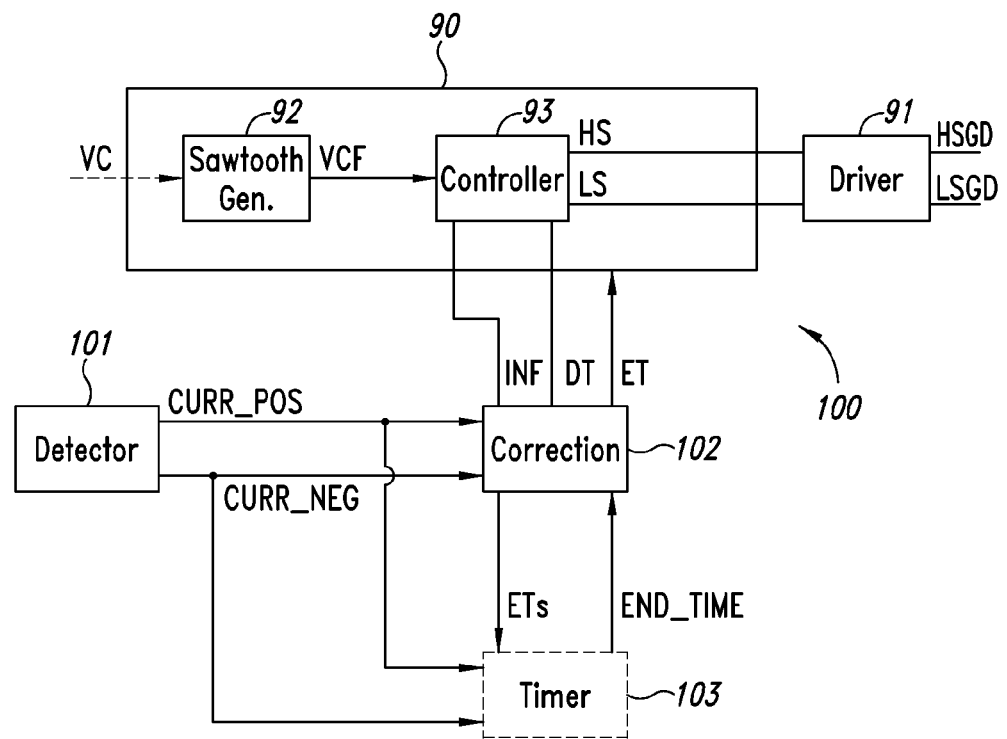
FIG. 7 shows an example of a control device according to the present disclosure.

FIG. 7 shows an example of the control device 100 according to the present disclosure; the control device 100 comprises a driving circuit 90 adapted to send the second information INF and the signal DT representative of the dead time Td to the correction circuit 102 which receives the signals CURR_POS, CURB_NEG from the detector 101. The correction circuit 102 sends to the driving circuit 90 a signal ET for a time extension of the dead time Td or the on time Ton of the transistor Q1 or Q2 if the current sign is not compliant; when the current sign becomes correct the signal ET ends. The driving circuit 90 sends signals HS, LS to a driver 91 which generates the signals HSGD and LSGD for driving the transistors Q1 and Q2. The driving circuit 90 comprises a saw tooth generator 92 configured to generate a saw tooth signal VCF, and a controller 93 configured to receive the signal VCF and generate the signals HS, LS, INF and DT. The controller 93 sends the signals HS, LS to the input of the driver 91 for generating the signals HSGD and LSGD. In the case wherein the resonant apparatus is a resonant converter, the driver 91 has the signal Vc as input signal.

Preferably the control device 100 comprises a timer 103 which starts the counting when the signals CURR_POS=CURR_NEG=H, that is when the voltage Vs is inside the band −Vos to Vos, and a time extension signal ET has been sent to the driving circuit 90. The timer 103 inputs the signals CURR_POS, CURR_NEG and the signal ETs indicating the time extension signal ET has been sent to the driving circuit 90. The timer 103 stops the counting after the prefixed time Tcount, for example 5 microseconds, and sends the signal END_TIME to the correction circuit 102 to stop the time extension of the dead time Td or the on time Ton of the transistor Q1 or Q2 in the case wherein the current sign is not corrected before the end of the time period Tcount.

Figure 7A:
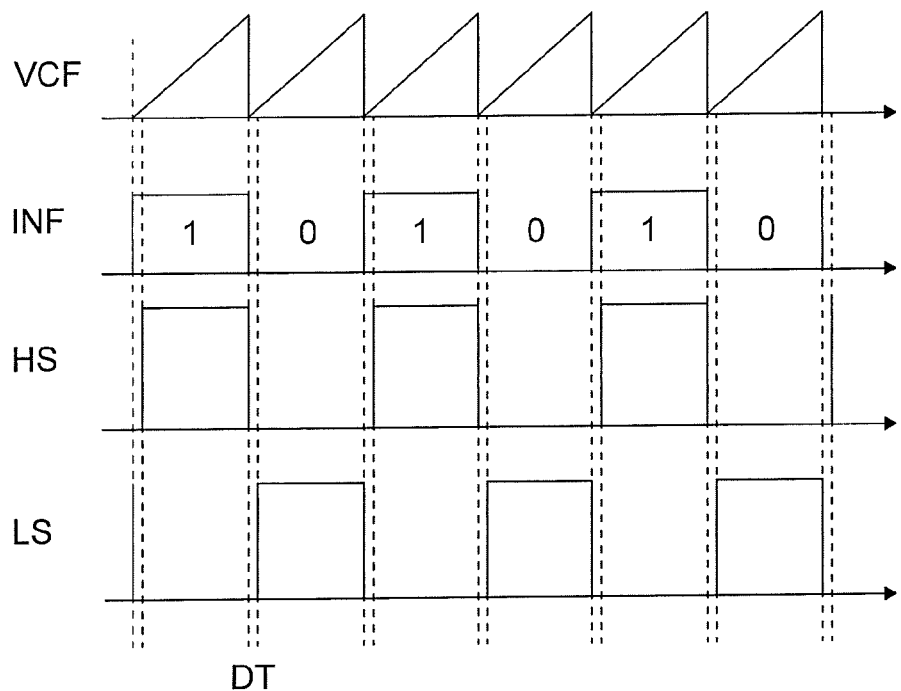
FIG. 7a shows the time diagrams of the voltage signals of the control device according to the disclosure.

The saw tooth generator 92 comprises preferably an oscillator including a capacitor connected to ground GND and charged with a current from zero to a peak value, preferably depending on the voltage Vc, and then quickly discharged, thus originating a quasi-triangular sawtooth voltage VCF. Each oscillator ramp defines the duration of the high or low level of the signal INF while the capacitor is discharged immediately after having reached the maximum reference value. FIGS. 7a shows the time diagrams of the signals HS, LS, INF and the voltage VCF; the signal INF at the high level corresponds to the signal HS while at the low level corresponds to the signal LS.

Figure 4:
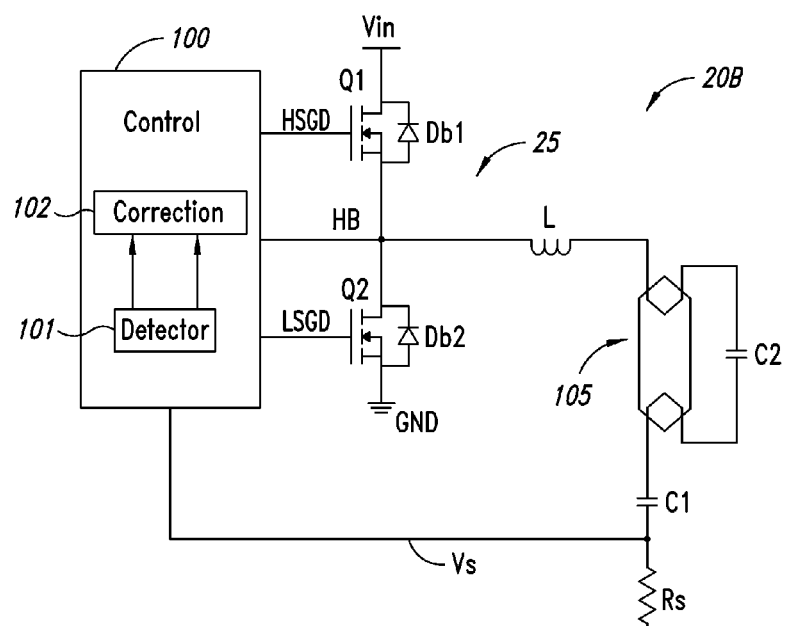
FIG. 4 is a circuit schematic of a resonant apparatus with a ballast according to a second embodiment of the present disclosure.
Figure 8A:
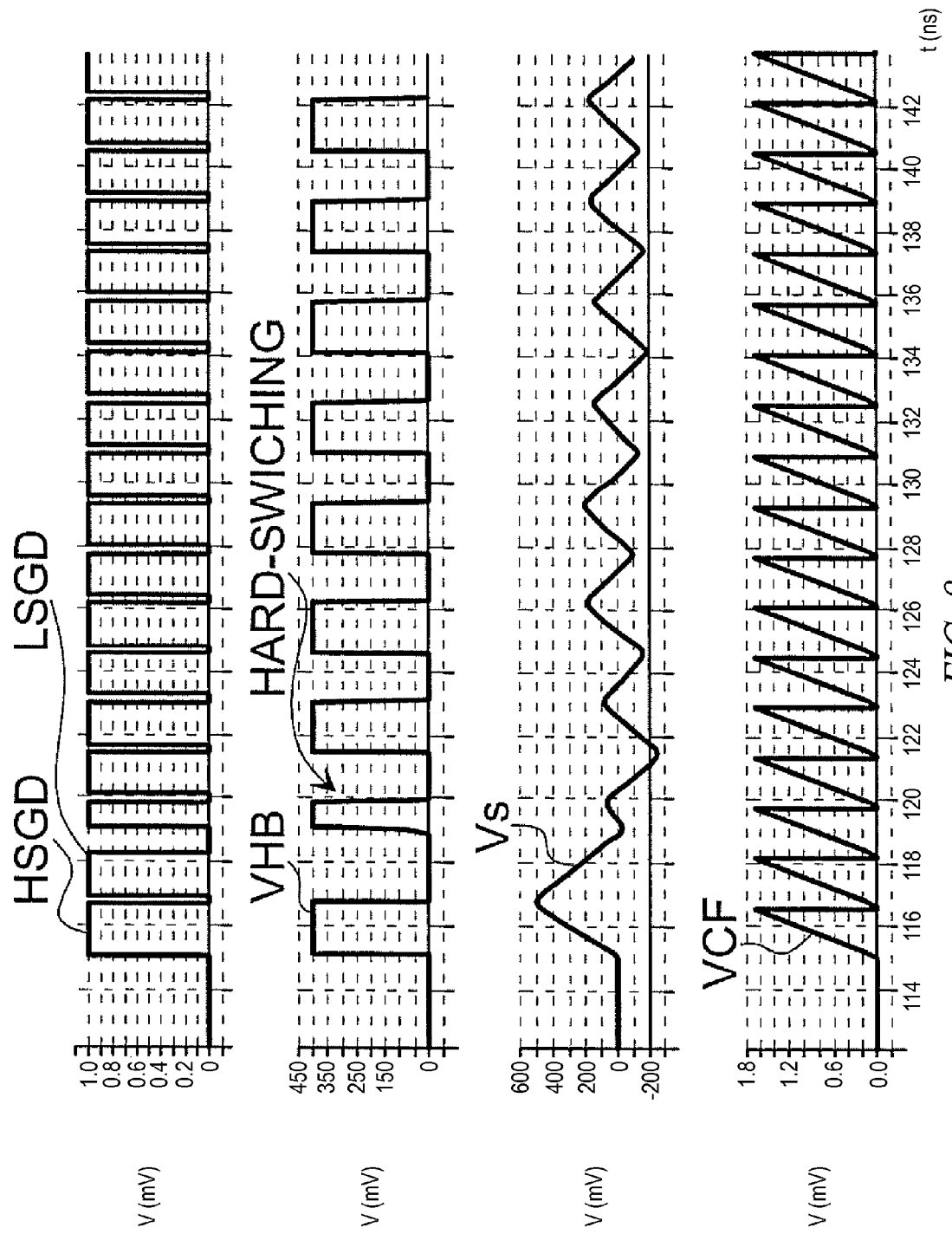
FIGS. 8a and 8b shows the time diagrams of the voltage signals of the control device according to prior art (FIG. 8a) and respectively to the disclosure in the case of time extension of the on time period (FIG. 8b)
Figure 8B:
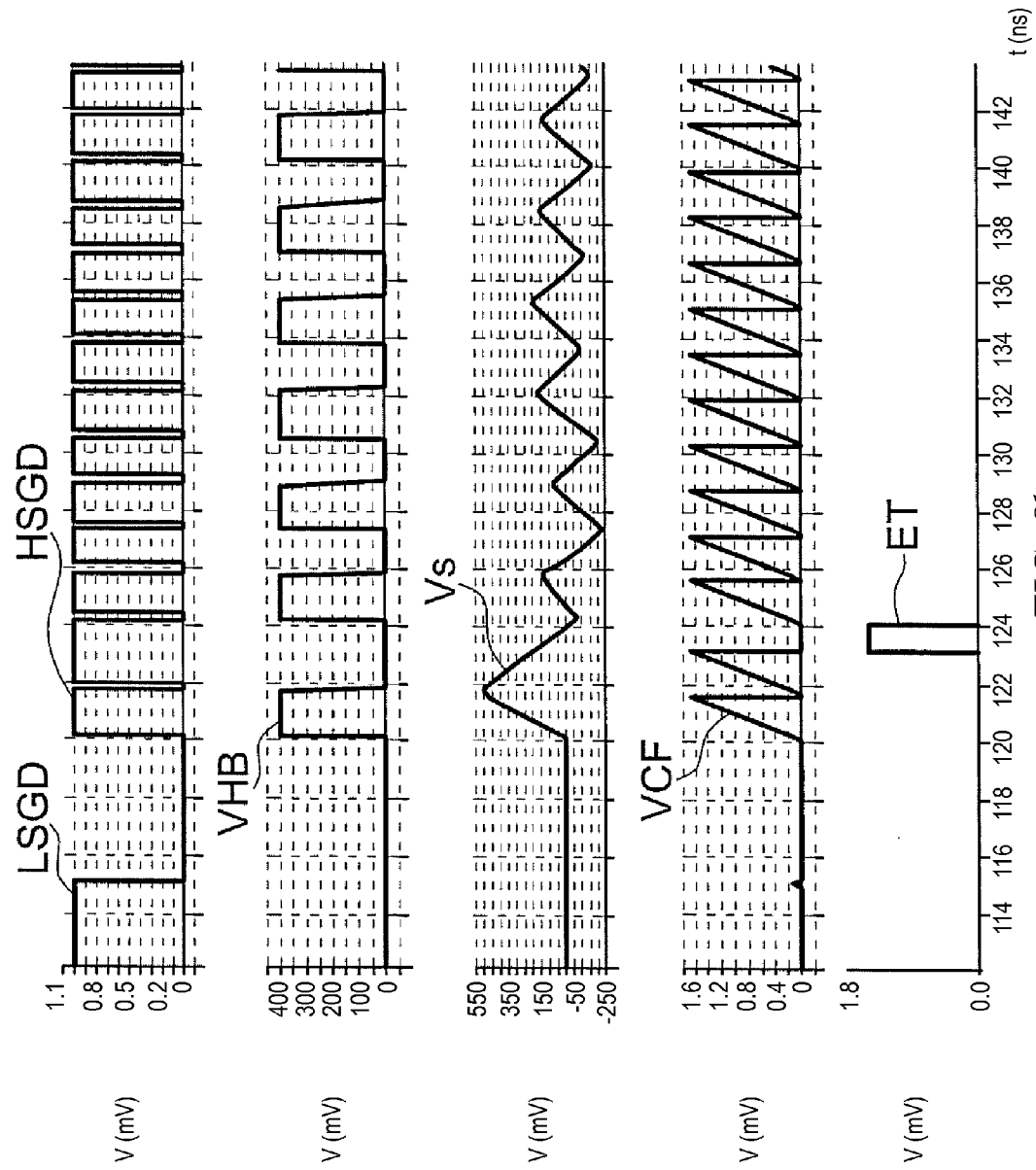

FIGS. 8a and 8b show the time diagrams of the signals HSGD, LSGD, Vs, VHB (the voltage at the node HB) and the voltage VCF respectively for a resonant converter according to prior art and the resonant converter according to the second embodiment of the present disclosure as shown in FIG. 4.

When a hard switching condition can occur, during an on time period Ton of a transistor Q1, Q2 (indicated by the word HARD-SWITCHING in FIG. 8a) the correction circuit 102 sends a signal ET to extend the Ton of the transistor Q1, Q2 (in the case of FIG. 8b the Ton of the transistor Q2 is extended); the time extension ends when the current sign is correct.

The control device 100 is typically integrated in a small silicon chip.

Figure 9:
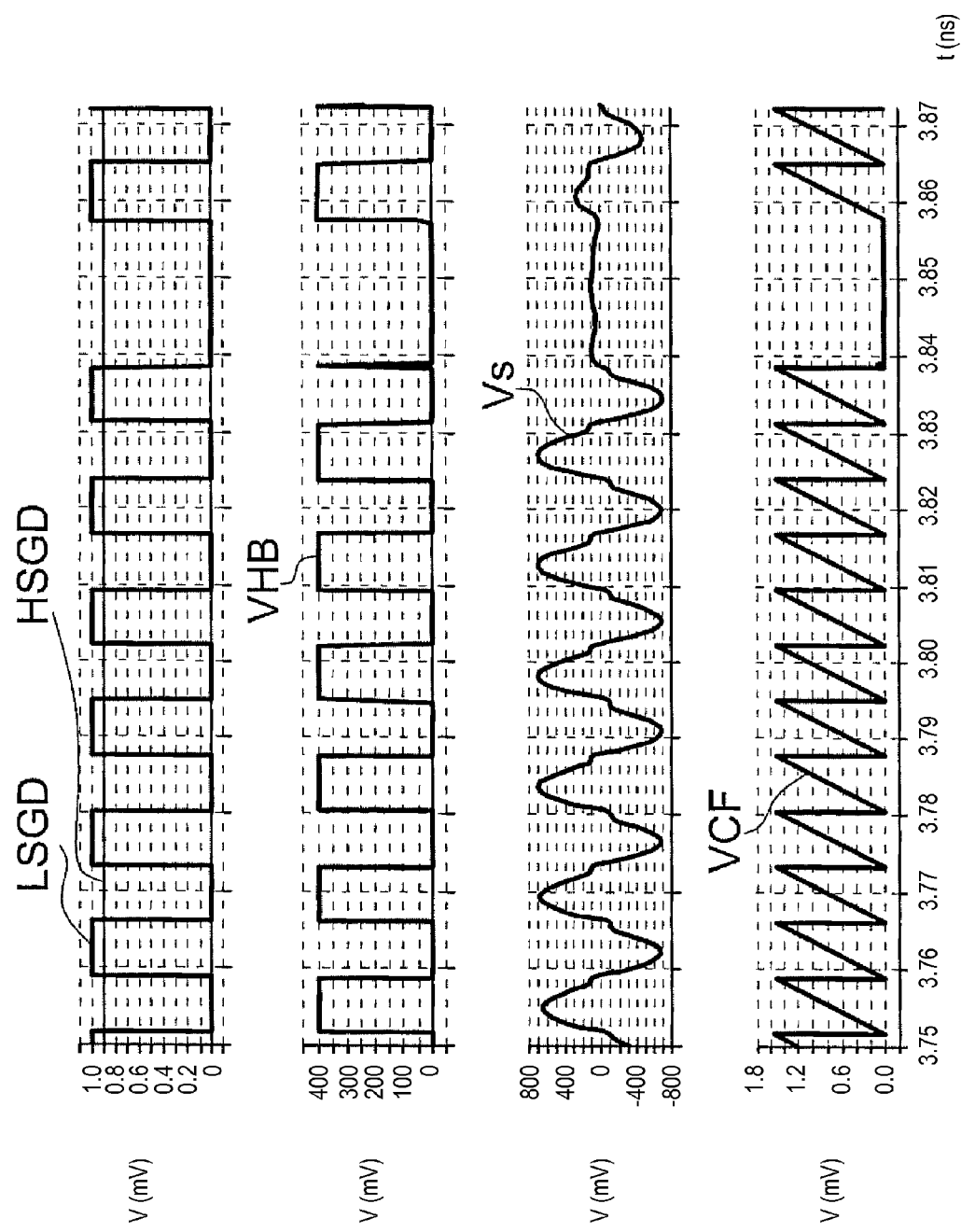
FIG. 9 shows the time diagrams of the voltage signals of the control device according to the disclosure in the case of time extension of the dead time period.

FIG. 9 shows the time diagrams of the signals HSGD, LSGD, Vs, VHB (the voltage at the node HB), the voltage VCF and the signal ET for a resonant converter according to the second embodiment of the present disclosure as shown in FIG. 4. When a hard switching condition can occur at the end of a dead time period Td of a transistor Q1, the correction circuit 102 sends a signal ET to extend the dead time Td of the transistors Q1 and Q2; the time extension ends when the current sign is corrected.

Figure 10:
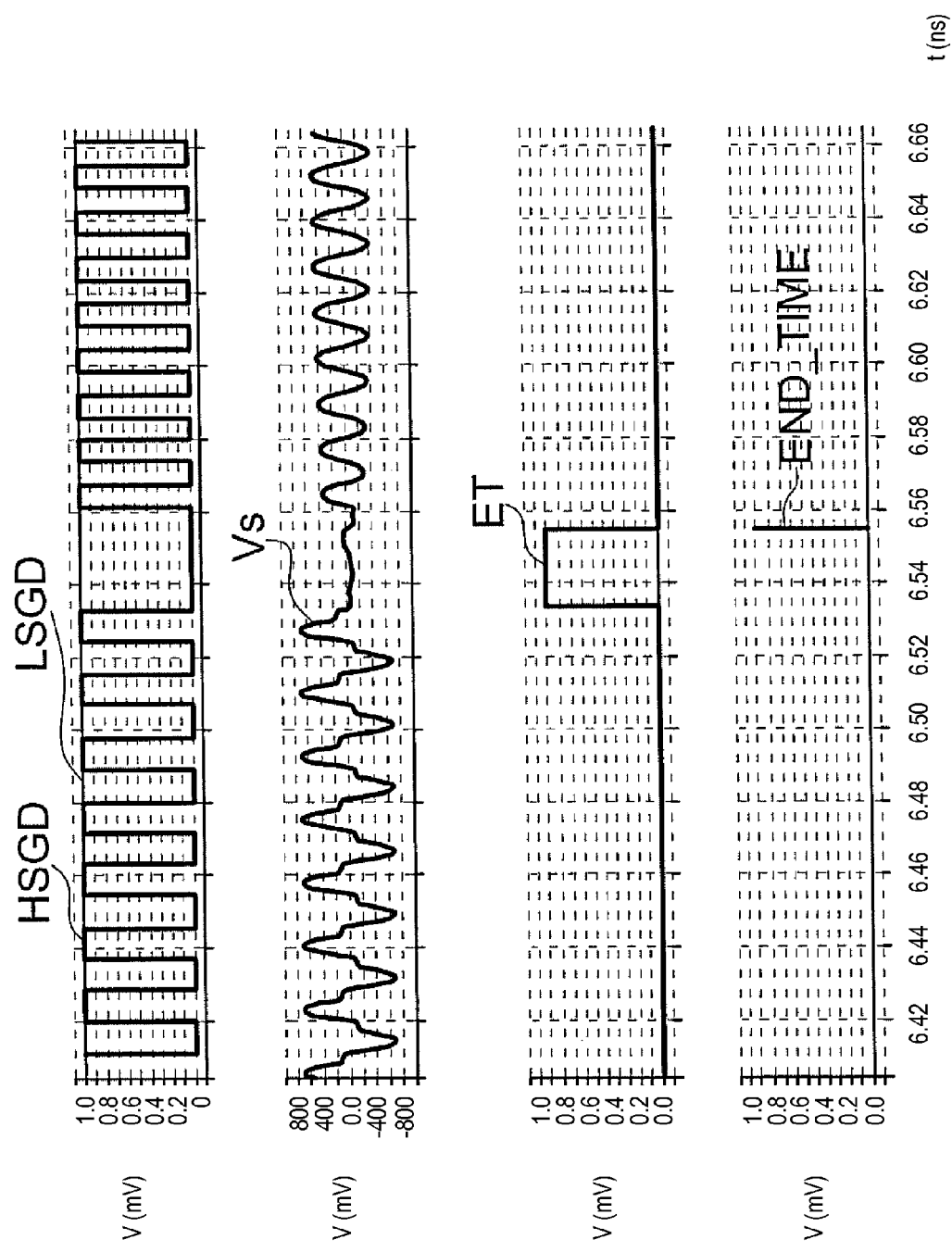
FIG. 10 shows the time diagrams of the voltage signals of the control device according to the disclosure in the case of time extension of a dead time period and the intervention of the timer.

FIG. 10 shows the time diagrams of the signals HSGD, LSGD, Vs, VHB (the voltage at the node HB), the voltage VCF and the signals ET and END_TIME for a resonant converter according to the second embodiment of the present disclosure as shown in FIG. 4 when the timer 103 forces the end of the time extension. When a hard switching condition can occur during a dead time period Td of a transistor Q1, the correction circuit 102 sends a signal ET to extend the dead time Td of the transistors Q1 and Q2 and the timer 103 sends an impulse END_TIME to stop the time extension and end the dead time Td after a time period Tcount is passed.

Figure 11:
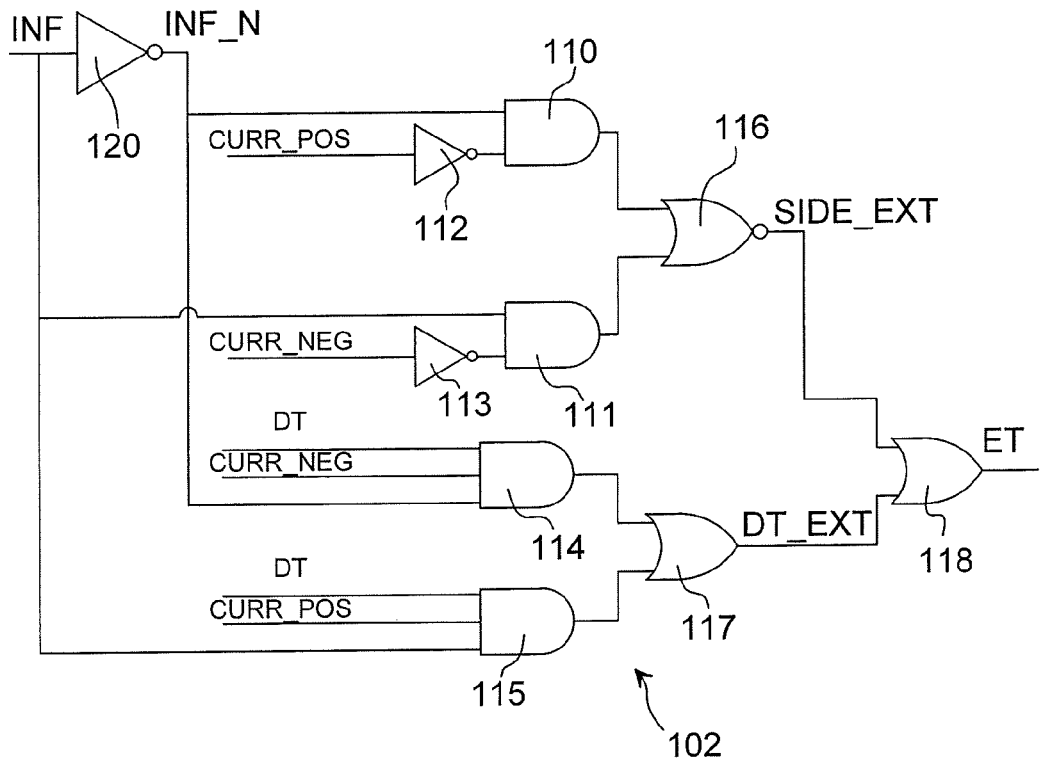
FIG. 11 shows an implementation of the correction circuit of the control device in FIG. 7.

FIG. 11 shows a possible circuit implementation of the correction circuit 102. The signal INF indicates which of the transistors Q1, Q2 is currently switched on or will be switched on after the dead time Td; the signal INF comprises a signal DT representative of a dead time Td of the transistors Q1 and Q2.

The correction circuit 102 includes a first inverter 120 that produces a signal INF_N by inverting the signal INF, a second inverter 112 that outputs an inverted version of the signal CURB POS received from the detector 101, and a third inverter 113 that outputs an inverted version of the signal CURB NEG received from the detector 101. The correction circuit 102 also includes a first AND gate 110, having input terminals respectively receiving the signal INF_N and the output signal of the second inverter 112, and a second AND gate 111 having input terminals respectively receiving the signal INF and the output signal of the third inverter 113. A NOR gate 116 inputs the output signals of the AND gates 110, 111 and the signal DT, and outputs the signal SIDE_EXT to control the extension of the time period Ton of one of the transistors Q1 or Q2.

The correction circuit 102 also includes a third AND gate 114, having input terminals respectively receiving the signals $INF_{13}N$, $CURB_{13}NEG$ and DT, and a fourth AND gate 115 having input terminals respectively receiving the signals INF, CURR_POS and DT. A NOR gate 117 inputs the output signals of the AND gates 114, 115 and outputs the signal DT_EXT to control the extension of the time period Td of the transistors Q1 or Q2. An OR gate 118, having input terminals that receive the signals SIDE_EXT and DT_EXT, outputs the signal ET.

Figure 12:
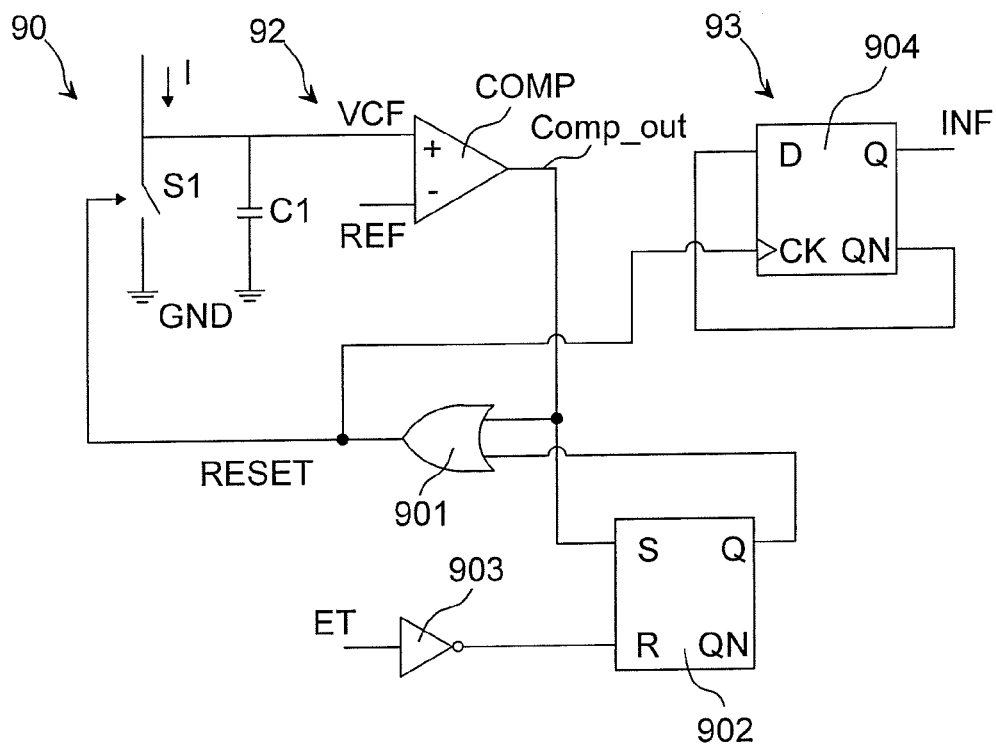
FIG. 12 shows an implementation of a part of the control device in
FIG. 7.

FIG. 12 shows a possible circuit implementation of a part of the control device 100, particularly a part of the driving circuit 90. The oscillator of the saw tooth generator 92 preferably comprises a capacitor C1 charged by the current I. The capacitor C1 is arranged in parallel to a switch 51 controlled by a signal RESET at the output of an OR gate 901. The oscillator is configured to generate the sawtooth voltage VCF at the non-inverting input terminal of a comparator COMP having a signal REF at its inverting input terminal When the voltage VCF reaches the voltage REF, the comparator COMP sends a pulse Comp-out to the OR gate 901 to close the switch 51 and discharge the capacitor C1 to ground GND. The signal comp-out is the set signal of a set-reset flip-flop 902 having as reset signal R the output of a NOT gate 903 that inputs the signal ET. The flip-flop 902 will be set only when an extension of the time period Ton or Td occurs (the signal ET is high). The signal at the output Q of the flip-flop 902 maintains high the signal RESET (the switch S1 is closed) until the signal ET is high. The driving circuit 90, preferably the controller 93, comprises a D flip-flop 904 having an input CK that receives the signal RESET, an input D coupled to its inverted output terminal QN, and an output terminal Q that outputs the signal INF which is changed from the low level to the high level or vice versa by the falling edge of the signal RESET, that is at the start instant of the ramps of the sawtooth signal VCF.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control device for controlling a switching circuit of a resonant apparatus, said control device comprising:
   a driver configured to alternatively set on time periods and off time periods of high-side and low-side transistors of the switching and a dead time of both the transistors to cause the switching circuit to output a periodic square-wave voltage to a resonant load;
   a detector configured to detect the sign of a current flowing through the resonant load; and
   a correction circuit configured to extend an operating time period of said transistors in response to at least the current sign detected by the detector.

2. The control device according to claim 1, wherein said detector is configured to detect a positive or a negative current sign if the value of the current is respectively higher than a negative threshold value or lower than a positive threshold value.

3. The control device according to claim 2, wherein said correction circuit is configured to extend the operating time period of said transistors if the value of the current is inside a band formed by the negative threshold value and the positive threshold value.

4. The control device according to claim 1, comprising a controller configured to generate information indicating which of the transistors to switch on, while the transistors are in dead time, or which of the transistors is currently switched on, said correction circuit being configured to extend the operating time period of said transistors in response to a combination of a current sign detected by the detector and said information.

5. The control device according to claim 4, wherein:
   said detector is configured to detect a positive or a negative current sign respectively if the value of the current is higher than a negative threshold value or lower than a positive threshold value; and
   said correction circuit is configured to extend the dead time period of said two transistors if:
   the high and low side transistors are currently in dead time and the next side to be switched on is the low side transistor while the detected current sign is negative, or
   the high and low side transistors are currently in dead time and the next side to be switched on is the high side transistor while the detected current sign is positive.

6. The control device according to claim 4, wherein:
   said detector is configured to detect a positive current sign if the value of the current is higher than a negative threshold value and a negative current sign if the value of the current is lower than a positive threshold value, and
   said correction circuit is configured to control the extension of the operating time period of said transistors while the detected current sign is negative and the high side transistor is currently switched on or while the detected current sign is positive and the low side transistor is currently switched on.

7. The control device according to claim 6, wherein said correction circuit is configured to end the extension of the operating time period of said transistors in response to:
   the current sign becoming positive when the low side transistor is next to be switched on and the low and high side transistors are currently in dead time or when the high side transistor is currently switched on; and
   the current sign becoming negative when the high side transistor is next to be switched on and low and high side transistors are currently in dead time or when the low side transistor is currently switched on.

8. The control device according to claim 1, wherein said correction circuit comprises a timer configured to stop the extension of the operating time period of said transistors in response to determining that a prefixed time period has passed from the instant in which a value of the current is inside a band between a negative threshold value and a positive threshold value.

9. The control device according to claim 1, wherein the control device is integrated in a semiconductor chip.

10. A resonant apparatus, comprising:
    a resonant load,
    a switching circuit coupled to the resonant load and including a half-bridge having a high-side transistor and a low-side transistor; and
    a control device configured to control the switching circuit, the control device including:
    a driver configured to alternatively set on time periods and off time periods of high-side and low-side transistors of the switching and a dead time of both the transistors to cause the switching circuit to output a periodic square-wave voltage to a resonant load;
    a detector configured to detect the sign of a current flowing through the resonant load; and
    a correction circuit configured to extend an operating time period of said transistors in response to at least the current sign detected by the detector.

11. The resonant apparatus according to claim 10, wherein said detector is configured to detect a positive or a negative current sign if the value of the current is respectively higher than a negative threshold value or lower than a positive threshold value.

12. The resonant apparatus according to claim 11, wherein said correction circuit is configured to extend the operating time period of said transistors if the value of the current is inside a band formed by the negative threshold value and the positive threshold value.

13. The resonant apparatus according to claim 10, wherein the control device includes a controller configured to generate information indicating which of the transistors to switch on, while the transistors are in dead time, or which of the transistors is currently switched on, said correction circuit being configured to extend the operating time period of said transistors in response to a combination of a current sign detected by the detector and said information.

14. The resonant apparatus according to claim 13, wherein:
said detector is configured to detect a positive or a negative current sign respectively if the value of the current is higher than a negative threshold value or lower than a positive threshold value; and
said correction circuit is configured to extend the dead time period of said two transistors if:
the high and low side transistors are currently in dead time and the next side to be switched on is the low side transistor while the detected current sign is negative, or
the high and low side transistors are currently in dead time and the next side to be switched on is the high side transistor while the detected current sign is positive.

15. The resonant apparatus according to claim 14, wherein said correction circuit is configured to end the extension of the operating time period of said transistors in response to:
the current sign becoming positive when the low side transistor is next to be switched on and the low and high side transistors are currently in dead time or when the high side transistor is currently switched on; and
the current sign becoming negative when the high side transistor is next to be switched on and low and high side transistors are currently in dead time or when the low side transistor is currently switched on.

16. The resonant apparatus according to claim 13, wherein:
said detector is configured to detect a positive current sign if the value of the current is higher than a negative threshold value and a negative current sign if the value of the current is lower than a positive threshold value, and
said correction circuit is configured to control the extension of the operating time period of said transistors while the detected current sign is negative and the high side transistor is currently switched on or while the detected current sign is positive and the low side transistor is currently switched on.

17. The resonant apparatus according to claim 10, wherein said correction circuit comprises a timer configured to stop the extension of the operating time period of said transistors in response to determining that a prefixed time period has passed from the instant in which a value of the current is inside a band between a negative threshold value and a positive threshold value.

18. A control method comprising:
determining an on time period and an off time period of a high-side transistor and a low-side transistor of a switching circuit of a resonant apparatus;
determining a dead time of both the transistors so that a periodic square-wave voltage is produced by the switching circuit;
detecting a sign of a current flowing through a resonant load of the resonant apparatus; and
controlling an extension of a current operating time period of said two transistors in response to at least the current sign detected in the detecting step.

19. The control method according to claim 18, wherein the detecting comprises detecting a positive current sign if the value of the current is higher than a negative threshold value and detecting a negative current sign if the value of the current is lower than a positive threshold value.

20. The control method according to claim 19, wherein said controlling comprises controlling the extension of the operating time period of said transistors if the value of the current is inside a band between the negative threshold value and the positive threshold value.

21. The control method according to claim 18, wherein:
the detecting comprises detecting a piece of information on which of the transistors will be switched on next, in the case wherein both the transistors are currently in dead time, or on which of two transistors is currently switched on; and
the controlling includes controlling the extension of the operating time period of said transistors in response to the current sign detected and to said piece of information.

22. The control method according to claim 21, wherein:
the detecting comprises detecting a positive current sign if a value of the current is higher than a negative threshold value and detecting a negative current sign if the value of the current is lower than a positive threshold value; and
the controlling includes controlling an extension of a dead time period of said transistors, that is when the high and low side transistors are currently in dead time, in response to determining that the detected current sign is negative and the low side transistor will be switched on next or determining that the detected current sign is positive and the high side transistor will be switched on next.

23. The control method according to claim 21, wherein:
the detecting comprises detecting a positive current sign if the value of the current is higher than a negative threshold value and detecting a negative current sign if the value of the current is lower than a positive threshold value; and
the controlling includes controlling the extension of the operating time period of said transistors in response to determining that the detected current sign is negative when the high side transistor is currently switched on or detecting that the detected current sign is positive when the low side transistor is currently switched on.

24. The control method according to claim 23, wherein the controlling includes ending the extension of the operating time period of said two transistors in response to:
determining that the current sign becomes positive when the low side transistor will be switched on next and the low and high side transistors are currently in dead time;
determining that the current sign becomes positive when the high side transistor is currently switched on;
determining that the current sign becomes negative when the high side transistor will be switched on next and low and high side transistors are currently in dead time;
determining that the current sign becomes negative when the low side transistor is currently switched on.

25. The control method according to claim 18, wherein said controlling comprises stopping the extension of the current operating time period of said two transistors in response to determining that a prefixed time period has passed from an instant at which the value of the current is inside a band between a negative threshold value and a positive threshold value.

* * * * *